United States Patent
Jung

(10) Patent No.: US 7,790,357 B2
(45) Date of Patent: Sep. 7, 2010

(54) METHOD OF FORMING FINE PATTERN OF SEMICONDUCTOR DEVICE

(75) Inventor: Jae Chang Jung, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 552 days.

(21) Appl. No.: 11/772,023

(22) Filed: Jun. 29, 2007

(65) Prior Publication Data

US 2008/0063986 A1 Mar. 13, 2008

(30) Foreign Application Priority Data

Sep. 12, 2006 (KR) .................... 10-2006-0087854
Jun. 28, 2007 (KR) .................... 10-2007-0064136

(51) Int. Cl.
*G03F 7/26* (2006.01)

(52) U.S. Cl. .................. 430/311; 430/314; 430/315; 430/394; 430/330

(58) Field of Classification Search .................. 430/312, 430/394, 311, 314, 315, 330
See application file for complete search history.

(56) References Cited

U.S. PATENT DOCUMENTS

| 6,051,678 | A | 4/2000 | Kim et al. |
| 6,132,926 | A | 10/2000 | Jung et al. |
| 6,143,463 | A | 11/2000 | Jung et al. |
| 6,150,069 | A | 11/2000 | Jung et al. |
| 6,180,316 | B1 | 1/2001 | Kajita et al. |
| 6,225,020 | B1 | 5/2001 | Jung et al. |
| 6,235,447 | B1 | 5/2001 | Lee et al. |
| 6,235,448 | B1 | 5/2001 | Lee et al. |
| 6,566,280 | B1 * | 5/2003 | Meagley et al. ............. 438/780 |
| 6,780,708 | B1 * | 8/2004 | Kinoshita et al. ........... 438/241 |
| 6,835,662 | B1 * | 12/2004 | Erhardt et al. .............. 438/689 |
| 2003/0230234 | A1 * | 12/2003 | Nam et al. .................... 117/97 |
| 2004/0102048 | A1 | 5/2004 | Yamaguchi |
| 2005/0142497 | A1 * | 6/2005 | Ryou et al. ................. 430/311 |

FOREIGN PATENT DOCUMENTS

| JP | 11283910 | 10/1999 |
| KR | 100140485 B1 | 3/1998 |

* cited by examiner

*Primary Examiner*—Kathleen Duda
*Assistant Examiner*—Caleen O Sullivan
(74) *Attorney, Agent, or Firm*—Townsend and Townsend and Crew LLP

(57) ABSTRACT

A method for forming a fine pattern of a semiconductor device includes forming a first photoresist pattern over a semiconductor substrate including an underlying layer. A cross-linking layer is formed on the sidewall of the first photoresist pattern. The first photoresist pattern is removed to form a fine pattern including a silicon polymer. A second photoresist pattern is formed that is coupled to the fine pattern. The underlying layer is etched using the fine pattern and the second photoresist pattern as an etching mask. As a result, the fine pattern has a smaller size than a minimum pitch.

20 Claims, 7 Drawing Sheets

METHOD OF FORMING FINE PATTERN OF SEMICONDUCTOR DEVICE

CROSS-REFERENCES TO RELATED APPLICATIONS

The present application claims priority to Korean patent application number 10-2006-0087854 and 10-2007-0064136, respectively filed on Sep. 12, 2006 and Jun. 28, 2007, which are incorporated by references in their entireties.

BACKGROUND OF THE INVENTION

The present invention generally relates to a method for forming a fine pattern of a semiconductor device which has a pitch beyond a lithography process limit.

Due to the popularization of information media such as computers, semiconductor device technology has advanced rapidly. Semiconductor devices are required to operate at a high speed and to have a high storage capacity. As a result, manufacturing technology of semiconductor device is required to manufacture a memory device of high capacity with improved integration, reliability and characteristics for accessing data.

In order to improve integration of the device, photolithography technology has developed to form fine patterns. The photolithography technology includes an exposure technology using chemically amplified Deep Ultra Violet (DUV) light sources such as ArF (193 nm) and VUV (157 nm), and a technology developing photoresist materials suitable for the exposure light sources.

The processing speed of semiconductor devices depends on the line-width of patterns. For example, as the pattern line-width is decreased, the processing speed is increased to improve device performance. Therefore, it is important to control a critical dimension of the pattern line-width depending on the size of the semiconductor device.

Instead of developing a photoresist material, a method for forming a fine pattern having a reduced line-width using a double exposure and etching process has been applied in current semiconductor device manufacturing processes.

A conventional method for forming a fine pattern of a semiconductor device using a double exposure process is described as follows with reference to FIG. 1.

An underlying layer and a hard mask film are formed over a semiconductor substrate. A first lithography process is performed to form a first photoresist pattern 11 where a line-and-space pattern on a cell region is connected to a circuit pattern on a peripheral (peri) region in a bridge type configuration. A second lithography process is performed to form a second photoresist pattern 13 where a line-and-space pattern on a cell region is connected to a circuit pattern on a peri region in a bridge configuration, as shown in FIG. 1. The first photoresist pattern 11 is alternately arranged with the second photoresist pattern 13 in the cell region.

However, it is difficult to control the overlapping uniformity in the cell region (a) by a resolution limit of the lithography equipment, and to form a pattern having a size less than a minimum pitch.

SUMMARY OF THE INVENTION

Various embodiments of the present invention are directed at providing a method for forming a fine pattern of a semiconductor device.

According to an embodiment of the present invention, a method for forming a fine pattern of a semiconductor device includes forming a first photoresist pattern on a cell region of a semiconductor substrate including an underlying layer. A silicon-containing polymer layer is formed over the first photoresist pattern and the semiconductor substrate to form a resulting structure. The resulting structure is exposed and baked to form a cross-linking layer at an interface between the first photoresist pattern and the silicon-containing polymer layer. The exposed and baked resulting structure is developed to form the cross-linking layer having a constant thickness on the sidewall of the first photoresist pattern. The cross-linking layer formed on an upper portion of the first photoresist pattern is etched until the upper portion of the first photoresist pattern is exposed. The exposed first photoresist pattern is removed to form a fine pattern comprising the cross-linking layer on the cell region. A second photoresist pattern coupled to the fine pattern is formed in a peri region of the semiconductor substrate but not the cell region. The underlying layer is patterned using the fine pattern and the second photoresist pattern as an etching mask to form an underlying layer pattern.

In one embodiment, a method for forming a fine pattern of a semiconductor device includes forming a hard mask film over a semiconductor substrate including an underlying layer. A first photoresist pattern is formed over cell region of the hard mask film. The first cross-linking layer is formed on the sidewall of the first photoresist pattern. The first photoresist pattern is then removed to form a first fine pattern comprising the first cross-linking layer. The hard mask film is patterned using the first fine pattern as an etching mask to form a hard mask film pattern.

A second photoresist pattern is formed between the hard mask film patterns in the cell region. The second cross-linking layer is formed on the sidewall of the second photoresist pattern.

The second photoresist pattern is then removed to form a second fine pattern comprising the second cross-linking layer. A third photoresist pattern coupled to the second fine pattern and the hard mask pattern is formed in a peri region of the semiconductor substrate but not the cell region. The underlying layer is patterned using the hard mask pattern, the second fine pattern and the third photoresist pattern as an etching mask to form an underlying layer pattern.

The silicon-containing polymer includes an epoxy group as a cross-linkable functional group. Specifically, an acid generated from the first photoresist pattern by the exposure process penetrates into the silicon-containing polymer layer, and breaks the bonding of the epoxy group. An end portion of the separated epoxy group in the silicon-containing polymer is cross-linked with the hydroxyl group of the photoresist material in the baking process. The silicon-containing polymer which is not involved in the cross-linking layer formation is removed in a subsequent developing process, but the cross-linking layer which cross-links with the photoresist pattern is formed on the photoresist pattern.

DETAILED DESCRIPTION OF THE SPECIFIC EMBODIMENT

The present invention will be described in detail with reference to the accompanying drawings.

FIGS. 2a through 2g are diagrams illustrating a method for forming a fine pattern of a semiconductor device according to an embodiment of the present invention.

Figure 2A:
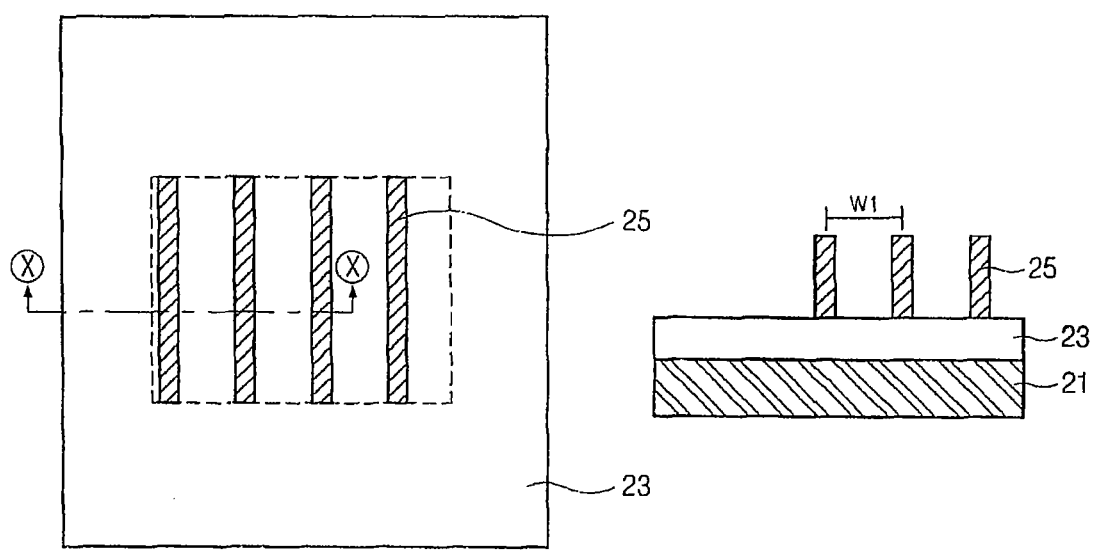
FIGS. 2a through 2g are sectional and plane diagrams illustrating a method for forming a fine pattern of a semiconductor device according to an embodiment of the present invention.

FIGS. 2a through 2d are plane diagrams illustrating one side of the pattern, and another view of the pattern taken along line ⓧ-ⓧ of FIG. 2a. FIGS. 2e and 2f are diagrams illustrating cross-sections viewed from line ⓧ-ⓧ of FIG. 2a. FIG. 2g is a plane diagram illustrating two patterns having a bridge configuration obtained by a lithography process.

FIG. 2a shows an underlying layer 23 formed over a semiconductor substrate 21. The underlying layer 23 includes a conductive layer for alternately forming bridge-type patterns. Specifically, the underlying layer 23 may be a word line, a bit line, a metal line or combination thereof that is formed of a polysilicon or metal layer.

A first photoresist film (not shown) is coated over the underlying layer 23. An exposure and developing process is performed on the photoresist film with an exposure mask to form a first photoresist pattern 25 having a line-width W1 in the cell region.

The first photoresist film includes a chemically amplified photoresist polymer, a photoacid generator and an organic solvent. Any photoresist polymers can be used such as those disclosed in U.S. Pat. No. 6,051,678 (Apr. 18, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Specifically, the polymer may include one of the following: poly(1-cyclohexene-1-t-butyl carboxylate/maleic anhydride/2-cyclohexene-1-ol); poly(1-cyclohexene-1-t-butylcarboxylate/maleic anhydride/3-cyclohexene-1-methanol); poly(1-cyclohexene-1-t-butyl carboxylate/maleic anhydride/3-cyclohexene-1,1-dimethanol); poly(3-cyclohexene-1-t-butylcarboxylate/maleic anhydride/2-cyclohexene-1-ol); poly(3-cyclohexene-1-t-butylcarboxylate/maleic anhydride/3-cyclohexene-1-methanol); poly(3-cyclohexene-1-ethoxypropyl carboxylate/maleic anhydride/3-cyclohexene-1-methanol); poly(3-cyclohexene-1-t-butyl carboxylate/maleic anhydride/3-cyclohexene-1,1-dimethanol); poly(3-(5-bicyclo[2.2.1]-heptene-2-yl)-1,1,1-(trifluoromethyl)propane-2-ol/maleic anhydride/2-methyl-2-adamantyl methacrylate/2-hydroxyethyl methacrylate); poly(3-(5-bicyclo[2.2.1]-heptene-2-yl)-1,1,1-(trifluoromethyl)propane-2-ol/maleic anhydride/2-methyl-2-adamantyl methacrylate/2-hydroxyethyl methacrylate/norbornylene); poly(3-(5-bicyclo[2.2.1]-heptene-2-yl)-1,1,1-(trifluoromethyl)propane-2-ol/maleic anhydride/t-butylmethacrylate/2-hydroxyethyl methacrylate); poly(t-butyl bicyclo[2.2.1]hept-5-en-2-carboxylate/2-hydroxyethyl bicyclo[2.2.1]hept-5-en-2-carboxylate/bicyclo [2.2.1]hept-5-en-2-carboxylic acid/maleic anhydride/2-hydroxyethyl bicyclo[2.2.1]hept-5-en-2-carboxylate); and poly (t-butyl bicyclo[2.2.1]hept-5-en-2-carboxylate/2-hydroxyethyl bicyclo[2.2.1]hept-5-en-2-carboxylate/bicyclo [2.2.1]hept-5-en-carboxylic acid/maleic anhydride/2-hydroxyethyl bicyclo[2.2.2]oct-t-en-2-carboxylate). Each of the above compounds contain monomers each having a hydroxyl group to improve substrate adhesiveness and cross-linking effects.

Any photoacid generators can be used to generate an acid by light. The photoacid generator may include one of the following: phthalimidotrifluoro methanesulfonate, dinitrobenzyltosylate, n-decyldisulfone, naphtylimidotrifluoro methanesulfonate, diphenyliodosalt hexafluorophosphate, diphenyliodosalt hexafluoroarsenate, diphenyliodosalt hexafluoroantimonate, diphenyl p-methoxyphenylsulfonium triflate, diphenyl p-toluenylsulfonium triflate, diphenyl p-isobutylphenylsulfonium triflate, triphenyl hexafluoroarsenate, triphenyl hexafluoroantimonate, triphenylsulfonium triflate or dibutylnaphtylsulfonium triflate.

The photoacid generator is present in an amount ranging from about 0.1 to 10 parts by weight, based on 100 parts by weight of the photoresist polymer. When the photoacid generator is present in the amount of less than 0.1 parts by weight, the sensitivity of the photoresist to light weakens. When the photoacid generator is present in the amount of more than 10 parts by weight, the photoacid generator absorbs a large amount of distant ultraviolet rays and generates many acids to obtain a pattern having an unfavorable cross-section.

The organic solvent may include one of the following: diethylene glycol diethyl ether, methyl 3-methoxypropionate, ethyl 3-ethoxypropionate, propylene glycol methyl-ether-acetate, cyclohexanone, 2-heptanone, and mixtures thereof. The organic solvent is present in an amount ranging from approximately 100 to 2000 parts by weight, based on 100 parts by weight of the photoresist polymer to obtain a photoresist film having a desired thickness.

Figure 2B:
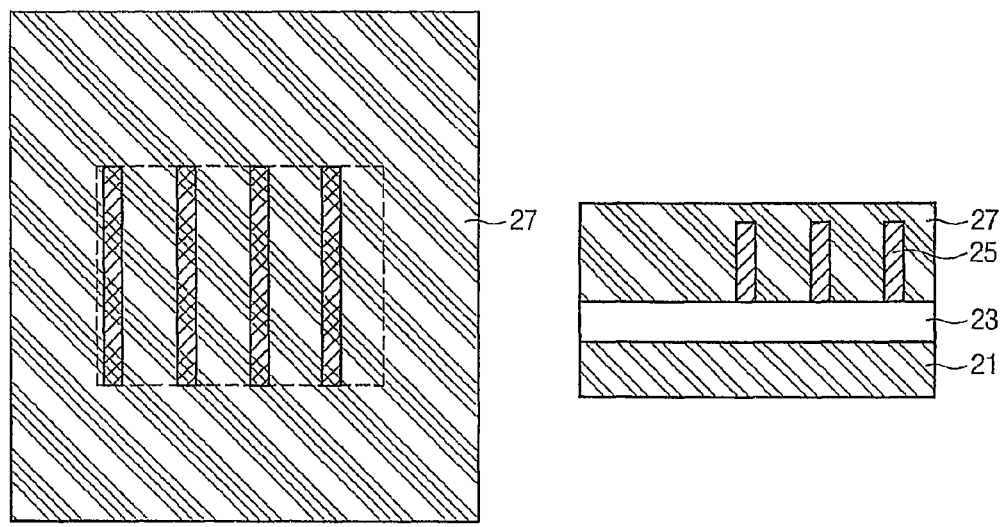

FIG. 2b shows a silicon-containing polymer layer 27 coated over the resulting structure including the first photoresist pattern 25.

The silicon-containing polymer includes silicon which is present in an amount ranging from about 10 to 40 wt %, based on the total weight of the polymer and an epoxy group that behaves as a cross-linkable functional group. When the silicon molecule is present in the amount of less than 10 wt %, a plurality of pores is generated in the cross-linking layer 29 after a blanket-etching process for exposing a top portion of the photoresist pattern 25 is performed. When the silicon molecule is present in the amount of more than 40 wt %, it is difficult to coat the silicon-containing polymer 27 uniformly over the first photoresist pattern.

The silicon-containing polymer layer can be obtained by providing a polymer composition comprising a silicon-containing polymer and a solvent such as a $C_7 \sim C_{10}$ alkane solvent or a $C_5 \sim C_{10}$ alcohol, spin-coating the polymer composition and baking. Specifically, the silicon-containing polymer includes polysiloxane compound, polysilsesquioxane compound or a mixture thereof.

For example, the $C_7 \sim C_{10}$ alkane solvent is selected from the group consisting of heptane, octane, nonane, decane and mixtures thereof. The $C_5 \sim C_{10}$ alcohol is selected from the group consisting of pentanol, heptanol, octanol, nonanol, decanol and mixtures thereof.

The resulting structure is exposed and baked so that the cross-linking layer 29 is formed at an interface between the first photoresist pattern and the silicon-containing polymer layer.

The exposure process is performed with an exposure energy ranging from about 10 to 100 mj/cm$^2$, and preferably from 40 to 60 mj/cm$^2$.

The acid generated from the photoresist pattern 25 by the exposure process cleaves the bonding of the epoxy group in the silicon-containing polymer layer 27. In the baking process, an end portion of the cleavage epoxy group is cross-linked with the hydroxyl group contained in the photoresist polymer.

The thickness of the cross-linking layer 29 can be regulated depending on the baking conditions. For example, when the baking process is performed at a temperature ranging from about 130 to 200° C., the cross-linking layer 29, which has the same width and thickness as the first photoresist pattern, is formed at an interface between the photoresist pattern and the silicon-containing polymer layer.

The resulting structure is developed to remove the silicon-containing polymer layer 27 which is not cross-linked with the photoresist pattern. As a result, the cross-linking layer 29 is formed on the sidewall of the first photoresist pattern 25, as shown in FIG. 2c.

In the developing process, a wafer on which the fine pattern is formed is dipped in n-pentanol for approximately 50 to 70 seconds.

Figure 2C:
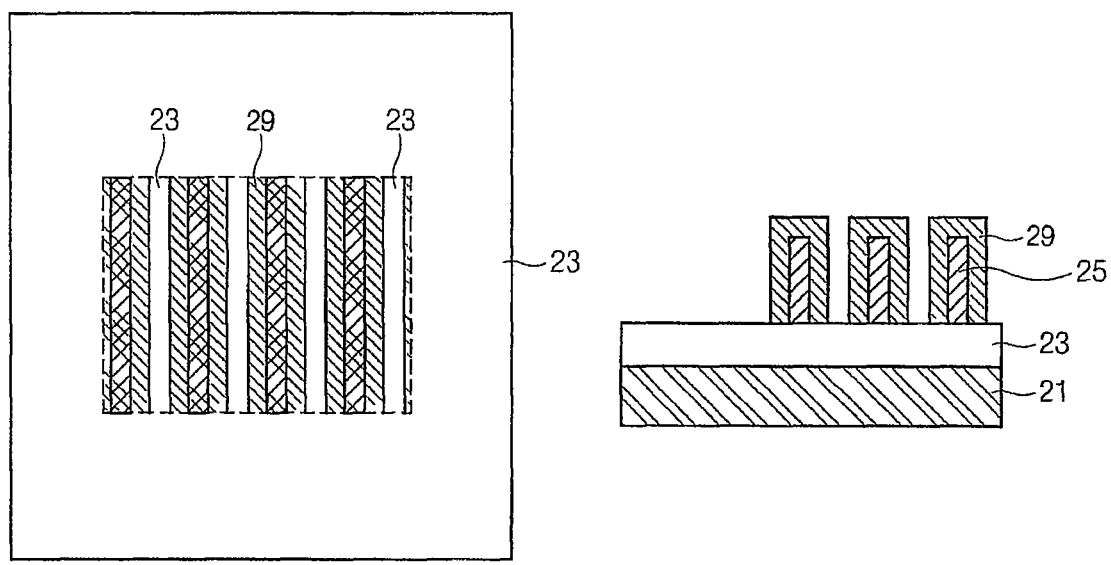
Figure 2D:
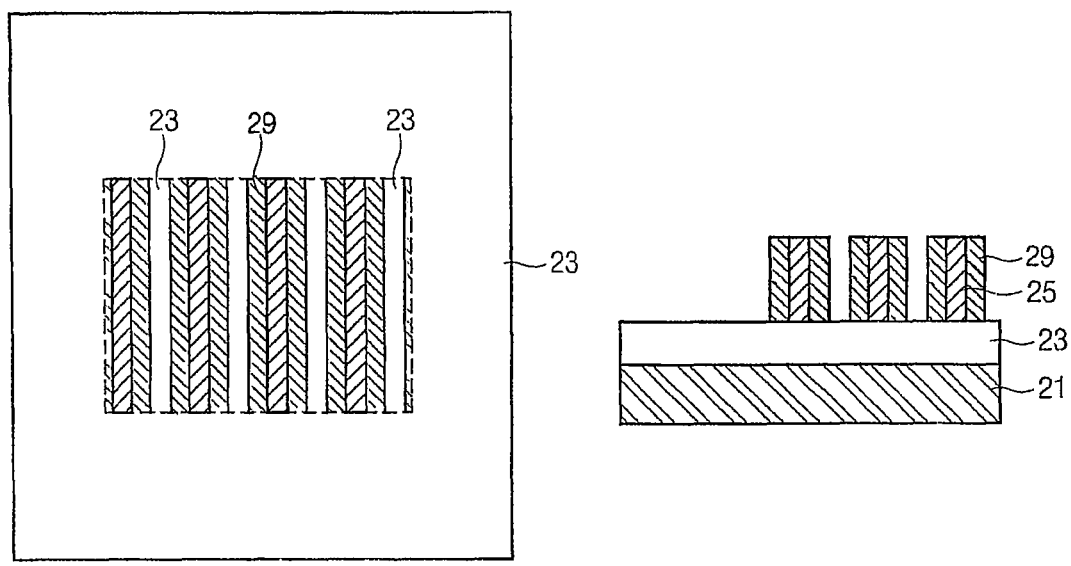
Figure 2E:
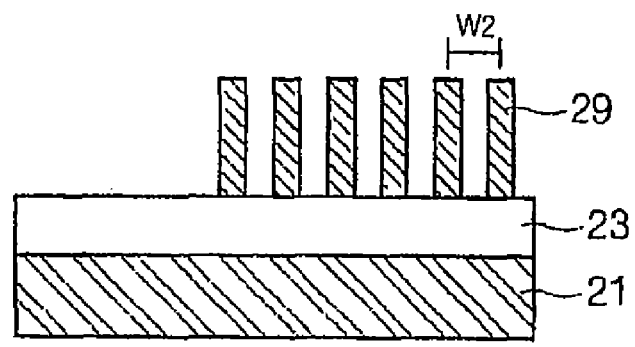
Figure 2F:
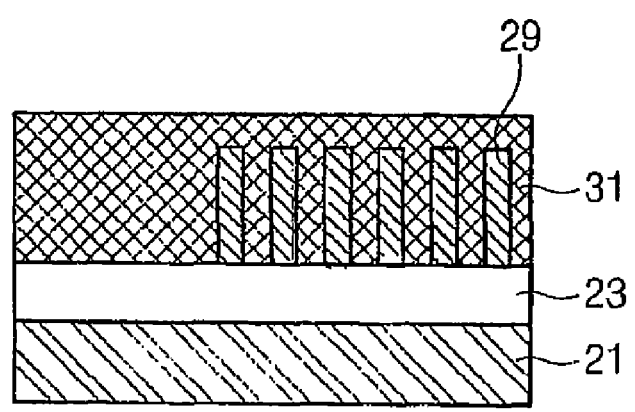
Figure 2G:
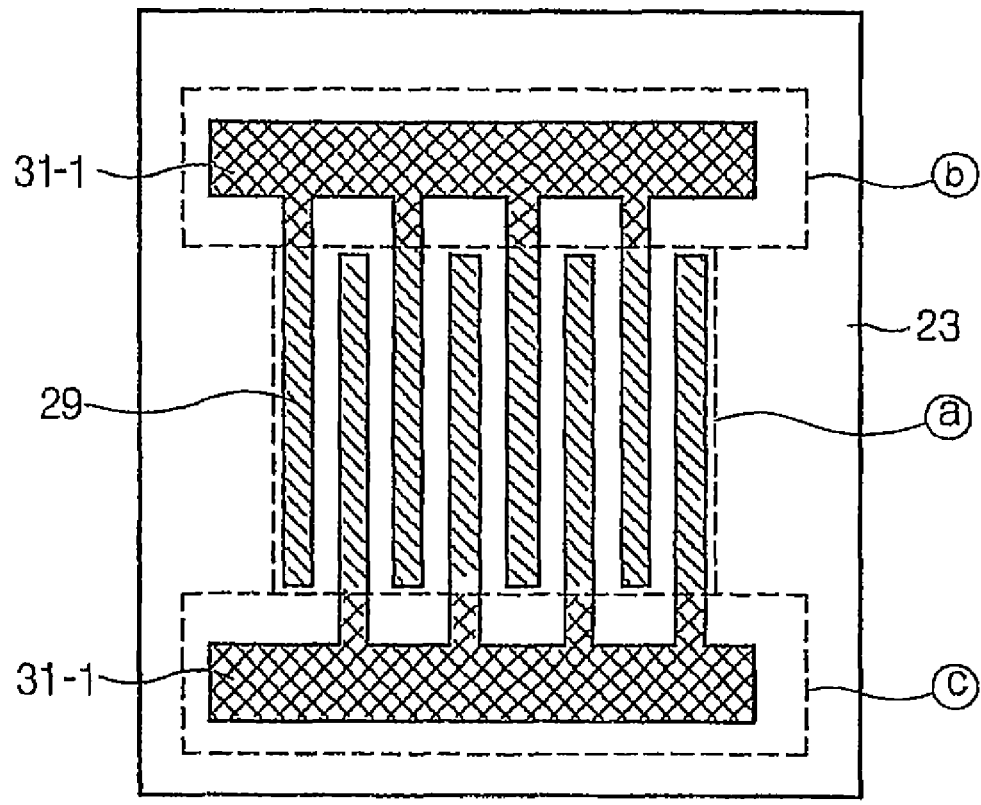

FIG. 2d shows the structure obtained by performing a blanket-etching process on the resulting structure of FIG. 2c to remove the cross-linking layer 29 until a top portion of the first photoresist pattern 25 is exposed.

The blanket-etching process is performed using a plasma etching gas comprising fluorine. Example plasma etching gases include $CF_4$, $CHF_3$, $C_2F_6$, $C_3F_8$, $C_4F_8$ and combinations thereof.

FIG. 2e shows the resulting structure obtained after removing the exposed first photoresist pattern 25 to remain the cross-linking layer 29. As a result, a fine pattern composed of the cross-linking layer 29 is formed on a cell region of the semiconductor substrate 21. The fine pattern has a line-width W2 (W1>W2).

The first photoresist pattern 25 is removed using a mixture gas atmosphere employing $O_2$ and $N_2$. Specifically, the first photoresist pattern is removed using an etching gas including $O_2$ and $N_2$ at a flow ratio (%) Of $O_2$:$N_2$=1-15%:85-99%, and preferably $O_2$:$N_2$=10:90.

After the first photoresist pattern is removed, the method may further comprise dipping the wafer in n-pentanol for about 50 to 70 seconds to wash the wafer.

FIG. 2f shows a second photoresist film 31 coated over the resulting structure. The second photoresist may include the same material used for the first photoresist film.

An exposure and developing process is performed on the second photoresist film 31 to form a second photoresist pattern 31-1 in a peri region (ⓑ and ⓒ) but not in a cell region ⓐ as shown FIG. 2g.

Figure 1:
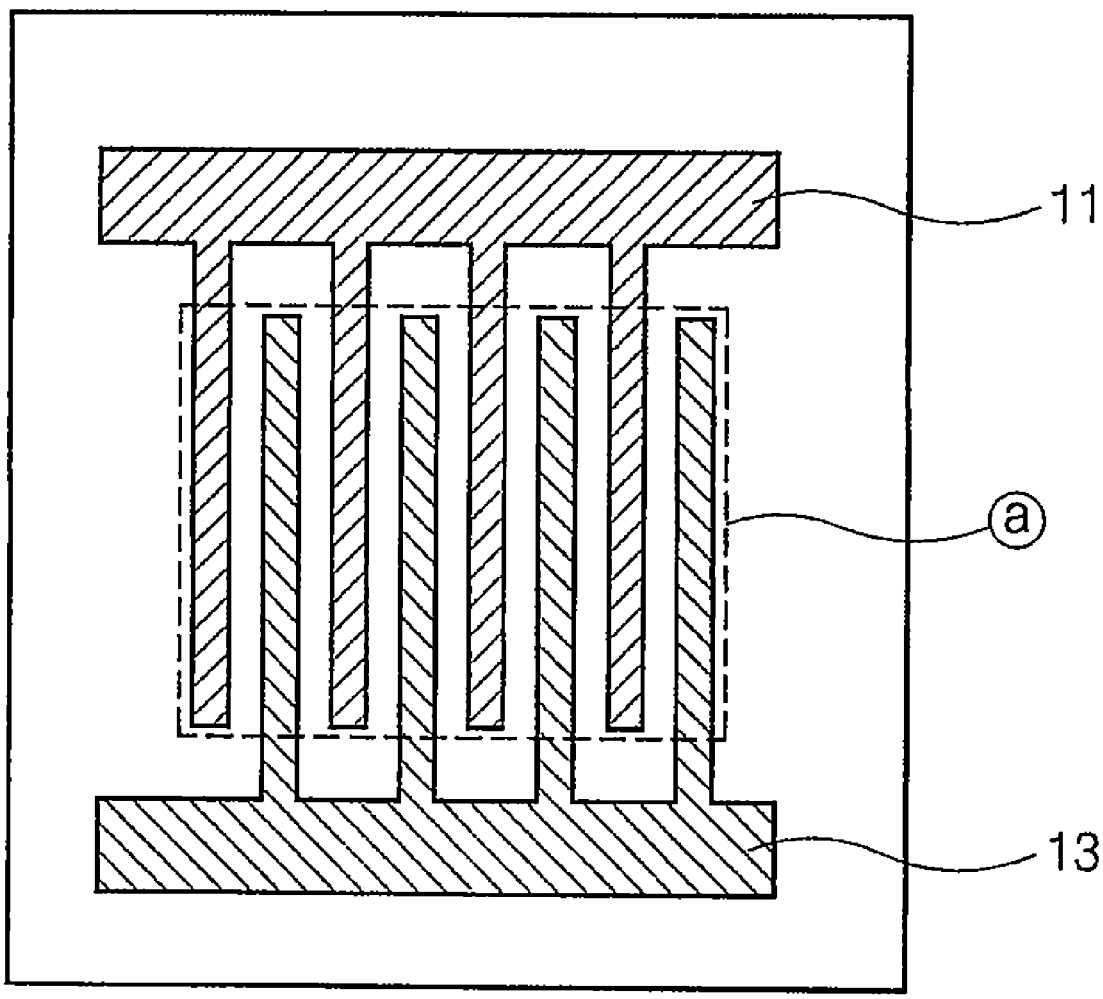
FIG. 1 is a plane diagram illustrating a method for forming a fine pattern of a semiconductor device.

The exposure process is performed with an exposure mask having a shielding unit that shields the cell region and a transmission unit that exposes the peri region but not the cell region. One side of the second photoresist pattern 31-1 is coupled to one side of the fine pattern 29 which is formed of the cross-linking layer 29. As a result, patterns having a bridge configuration are alternately formed as shown FIG. 1.

In order to overcome limits of the currently used lithography equipment due to high integration of semiconductor devices, a fine pattern 29 using a polymer 27 containing silicon is formed over a cell part (a), and a second photoresist pattern is formed in regions (b) and (c) except the cell region (a). An underlying layer 23 is etched (not shown) with the fine pattern 29 of the cell region (a) and the second photoresist pattern 31 of the regions (b) and (c). As a result, underlying patterns (not shown) are arranged alternately with a bridge type to overcome limits of the lithography process.

In an embodiment of the present invention, a method for forming a fine pattern of a semiconductor device may perform the processes of FIGS. 2a through 2e at least twice.

Specifically, an amorphous carbon layer as a hard mask film (not shown) is formed over a semiconductor substrate including an underlying layer. A first photoresist pattern is formed on the cell region of the hard mask film. The first cross-linking layer is formed on the sidewall of the first photoresist pattern. The first photoresist pattern is then removed to form a first fine pattern comprising the first cross-linking layer.

The hard mask film is patterned using the first fine pattern as an etching mask to form a hard mask film pattern.

A second photoresist pattern is formed between the hard mask film patterns. The second cross-linking layer is formed on the sidewall of the second photoresist pattern. The second photoresist pattern is then removed to form a second fine pattern comprising the second cross-linking layer. A third photoresist pattern coupled to the second fine pattern and the hard mask pattern is formed in a peri region of the semiconductor substrate but not the cell region.

The third photoresist pattern is formed by using an exposure mask having a shading portion where the hard mask pattern is connected to the third photoresist pattern and an exposure mask having a shading portion where the second fine pattern is connected to the third photoresist pattern, or by shifting an exposure mask where one of the connection portions is shaded.

The underlying layer is patterned using the hard mask pattern, the second fine pattern and the third photoresist pattern as an etching mask to form a underlying layer pattern.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a fine pattern of a semiconductor device, the method comprising:
    forming a first photoresist pattern over a cell region of a semiconductor substrate including an underlying layer;
    forming a cross-linking layer on the sidewall of the first photoresist pattern;
    removing the first photoresist pattern to form a fine pattern comprising the cross-linking layer over the cell region;
    forming a second photoresist pattern coupled to the fine pattern, wherein the second photoresist pattern is formed over a peripheral region of the semiconductor substrate but not over the cell region; and
    patterning the underlying layer using the fine pattern and the second photoresist pattern as an etching mask.

2. The method according to claim 1, wherein the underlying layer is selected from the group consisting of: a word line, a bit line, a metal line and the combination thereof.

3. The method according to claim 1, wherein forming the cross linking layer comprises:
    providing a polymer composition comprising a silicon-containing polymer and an organic solvent;
    coating the polymer composition over the first photoresist pattern and the underlying layer to form the silicon-containing polymer layer;
    performing an exposing process and a baking process on the silicon-containing polymer layer to form the cross-linking layer at an interface between the first photoresist pattern and the silicon-containing polymer layer;
    removing the remaining silicon-containing polymer layer which is not involved in the cross-linking layer formation; and
    blanket-etching the cross-linking layer until an upper portion of the first photoresist pattern is exposed.

4. The method according to claim 3, wherein the organic solvent includes a $C_7$-$C_{10}$ alkane solvent and $C_5$-$C_{10}$ alcohol.

5. The method according to claim 4, wherein the alkane solvent is selected from the group consisting of heptane, octane, nonane, decane and a mixture thereof.

6. The method according to claim 4, wherein the alcohol is selected from the group consisting of pentanol, heptanol, octanol, nonanol, decanol and a mixture thereof.

7. The method according to claim 3, wherein the silicon-containing polymer comprises silicon in an amount ranging from 10 to 40 wt % based on a total weight of the silicon-containing polymer.

8. The method according to claim 3, wherein the silicon-containing polymer comprises a cross-linkable functional group.

9. The method according to claim 3, wherein the cross-linkable functional group is an epoxy group.

10. The method according to claim 3, wherein the silicon-containing polymer is a polysiloxane compound, a polysilsesquioxane compound or a mixture thereof.

11. The method according to claim 3, wherein the baking process is performed at a temperature capable of making a thickness of the cross-linking layer uniform.

12. The method according to claim 11, wherein the baking process is performed at a temperature ranging from 130 to 200° C.

13. The method according to claim 3, wherein the blanket-etching the cross linking layer process is performed using an etching gas comprising fluorine.

14. The method according to claim 13, wherein the etching gas is selected from the group consisting of: $CF_4$, $CHF_3$, $C_2F_6$, $C_3F_8$, $C_4F_8$, and combinations thereof.

15. The method according to claim 1, wherein the removing the first photoresist pattern is performed using a mixture etching gas including oxygen and nitrogen at a flow ratio of $O_2:N_2=1\text{-}15\%:85\text{-}99\%$.

16. The method according to claim 1, further comprising dipping the wafer in an n-pentanol solution after removing the photoresist pattern.

17. A method for forming a fine pattern of a semiconductor device, the method comprising:
  forming a hard mask film over a semiconductor substrate including an underlying layer;
  forming a first photoresist pattern on a cell region of the hard mask film;
  forming a first cross-linking layer on the sidewall of the first photoresist pattern;
  removing the first photoresist pattern to form a first fine pattern comprising the first cross-linking layer;
  patterning the hard mask film using the first fine pattern as an etching mask;
  forming a second photoresist pattern between the hard mask film patterns;
  forming a second cross-linking layer on the sidewall of the second photoresist pattern;
  removing the second photoresist pattern to form the second fine pattern comprising the second cross-linking layer;
  forming a third photoresist pattern coupled to the second fine pattern and the hard mask pattern in a peripheral region; and
  patterning the underlying layer using the hard mask pattern, the second fine pattern and the third photoresist pattern as an etching mask to form an underlying layer pattern.

18. The method according to claim 17, wherein the hard mask film includes an amorphous carbon layer.

19. The method according to claim 17, wherein forming the first cross linking layer comprises:
  providing a polymer composition comprising a silicon-containing polymer and an organic solvent;
  coating the polymer composition over the first photoresist pattern and the hard mask film to form a first silicon-containing polymer layer;
  performing an exposing process and a baking process on the first silicon-containing polymer layer to form the cross-linking layer at an interface between the first photoresist pattern and the first silicon-containing polymer layer;
  removing the remaining silicon-containing polymer layer which is not involved in the cross-linking layer formation; and
  blanket-etching the first cross-linking layer until an upper portion of the first photoresist pattern is exposed.

20. The method according to claim 17, wherein forming the second cross linking layer comprises:
  providing a polymer composition comprising a silicon-containing polymer and an organic solvent;
  coating the polymer composition over the second photoresist pattern to form a second silicon-containing polymer layer;
  performing an exposing process and a baking process on the second silicon-containing polymer layer to form the second cross-linking layer at an interface between the second photoresist pattern and the second silicon-containing polymer layer;
  removing the remaining silicon-containing polymer layer which is not involved in the cross-linking layer formation; and
  blanket-etching the second cross-linking layer until an upper portion of the second photoresist pattern is exposed.

* * * * *